US012601084B2

(12) United States Patent
Jeon et al.

(10) Patent No.: US 12,601,084 B2
(45) Date of Patent: Apr. 14, 2026

(54) PREMELTER FOR PRELIMINARILY MELTING SILICON TO BE SUPPLIED TO MAIN CRUCIBLE AND CONTROL METHOD THEREOF

(71) Applicants: HANWHA SOLUTIONS CORPORATION, Seoul (KR); HANWHA CORPORATION, Seoul (KR)

(72) Inventors: Han Woong Jeon, Seoul (KR); Jin Sung Park, Seoul (KR); Young Jun Lee, Seoul (KR); Young Min Lee, Seoul (KR); Young Hwan Lee, Seoul (KR)

(73) Assignees: HANWHA SOLUTIONS CORPORATION, Seoul (KR); HANWHA CORPORATION, Seoul (KR)

( * ) Notice: Subject to any disclaimer, the term of this patent is extended or adjusted under 35 U.S.C. 154(b) by 258 days.

(21) Appl. No.: 18/028,251

(22) PCT Filed: Sep. 3, 2021

(86) PCT No.: PCT/KR2021/011928
§ 371 (c)(1),
(2) Date: Mar. 24, 2023

(87) PCT Pub. No.: WO2022/065735
PCT Pub. Date: Mar. 31, 2022

(65) Prior Publication Data
US 2023/0374696 A1 Nov. 23, 2023

(30) Foreign Application Priority Data
Sep. 24, 2020 (KR) ........................ 10-2020-0124116

(51) Int. Cl.
*C30B 15/02* (2006.01)
*C30B 15/00* (2006.01)
(Continued)

(52) U.S. Cl.
CPC ............ *C30B 15/02* (2013.01); *C30B 15/002* (2013.01); *C30B 15/10* (2013.01); *C30B 15/20* (2013.01); *C30B 29/06* (2013.01)

(58) Field of Classification Search
CPC ...... C30B 29/06; C30B 35/002; C30B 35/007
See application file for complete search history.

(56) References Cited

U.S. PATENT DOCUMENTS 3,554,512 A * 1/1971 Elliott ................... C30B 35/002
219/121.33
5,242,531 A 9/1993 Klingshirn et al.
(Continued)

FOREIGN PATENT DOCUMENTS

CN 213507164 U * 6/2021
JP 11-092276 A 4/1999
(Continued)

OTHER PUBLICATIONS

International Search Report for PCT/KR2021/011928 dated Dec. 23, 2021.
(Continued)

*Primary Examiner* — Hua Qi
(74) *Attorney, Agent, or Firm* — Sughrue Mion, PLLC

(57) ABSTRACT

The present invention relates to a premelter for pre-melting silicon before supplying to a main crucible capable of accurately measuring an input amount of molten silicon input into an ingot growth crucible, thereby effectively controlling the input amount, and a method for controlling the same. According to an embodiment of the present invention, disclosed is a premelter for pre-melting silicon
(Continued)

before supplying to a main crucible, comprising: a preliminary crucible for supplying silicon in a molten state to a main crucible in which an ingot is grown after heating the silicon material in a solid state to become silicon in a molten state; a preliminary crucible moving module configured to tilt the preliminary crucible to one of a first position in which the preliminary crucible contains the solid silicon material or the molten silicon or a second position where the molten silicon in the preliminary crucible flows into the main crucible; and a control unit for controlling the preliminary crucible moving module.

13 Claims, 7 Drawing Sheets

(51) Int. Cl.
 C30B 15/10 (2006.01)
 C30B 15/20 (2006.01)
 C30B 29/06 (2006.01)

(56) References Cited

U.S. PATENT DOCUMENTS

2011/0158887 A1* 6/2011 Stoddard ................. C30B 29/06
 432/2
2018/0066377 A1* 3/2018 Hayashi ................. C30B 15/04

FOREIGN PATENT DOCUMENTS

| JP | 2003201197 A | * | 7/2003 |
| JP | 2004155624 A | * | 6/2004 |
| JP | 2013-129551 A |  | 7/2013 |
| JP | 2020063163 A | * | 4/2020 |
| KR | 10-2006-0128033 A |  | 12/2006 |
| KR | 10-2271455 B1 |  | 7/2021 |

OTHER PUBLICATIONS

Office Action issued May 7, 2023 in Chinese Application No. 202011404020.7.

* cited by examiner

【FIG. 2】
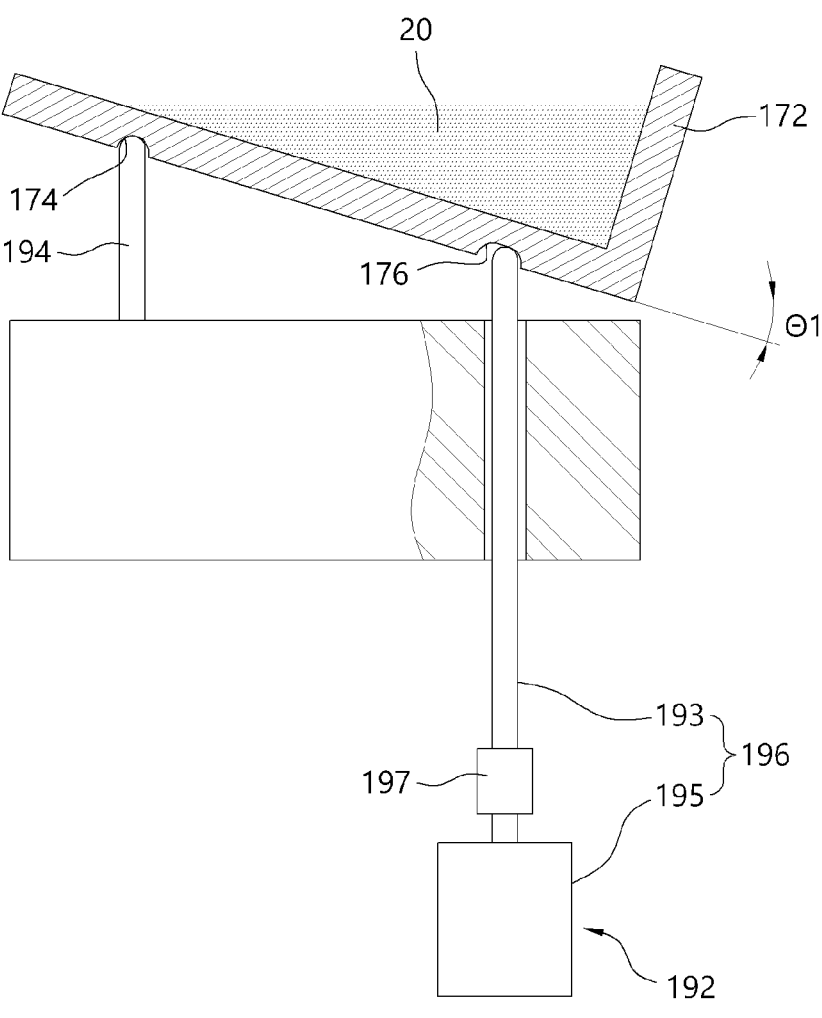

【FIG. 3】
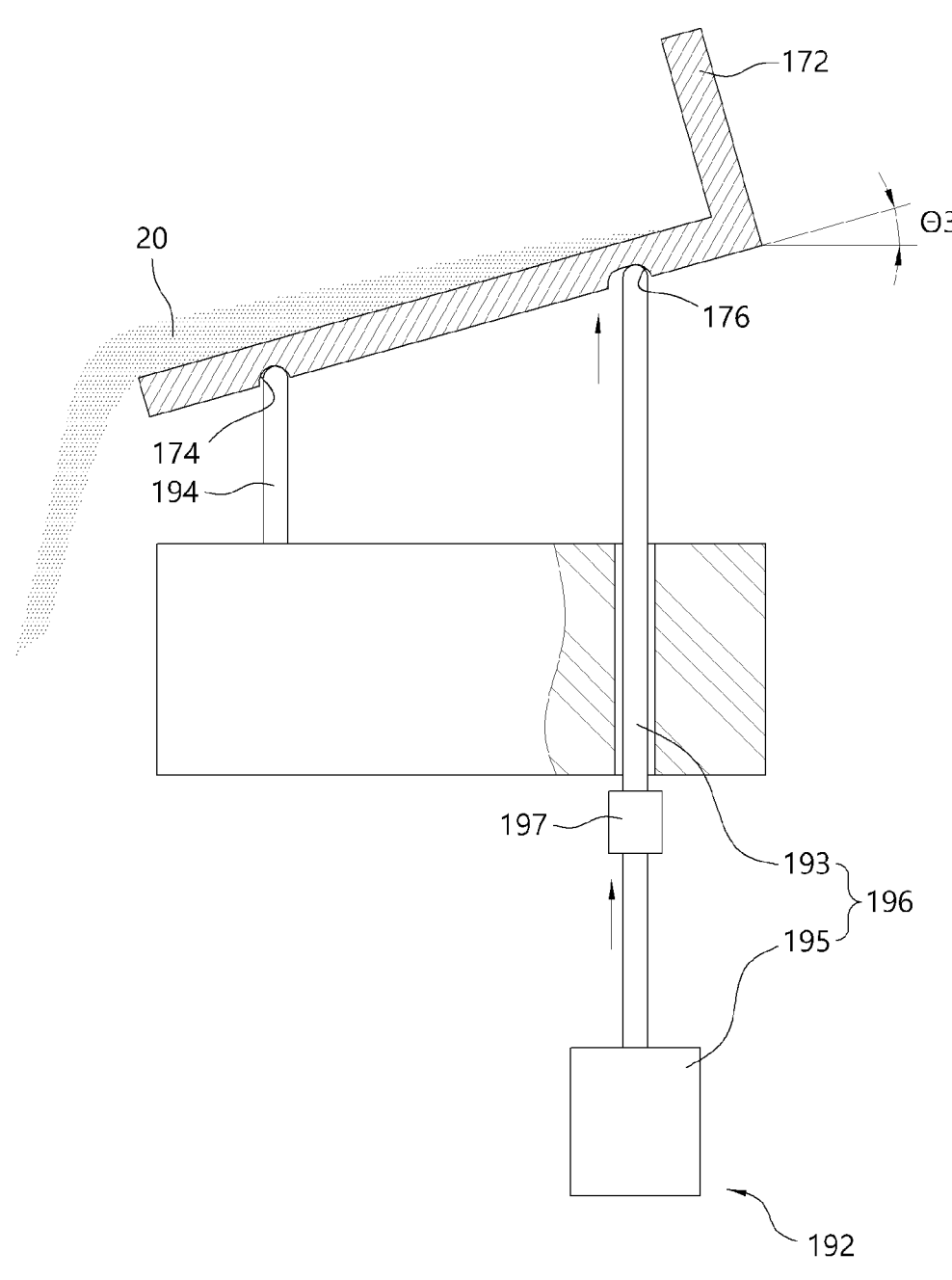

【FIG. 4】
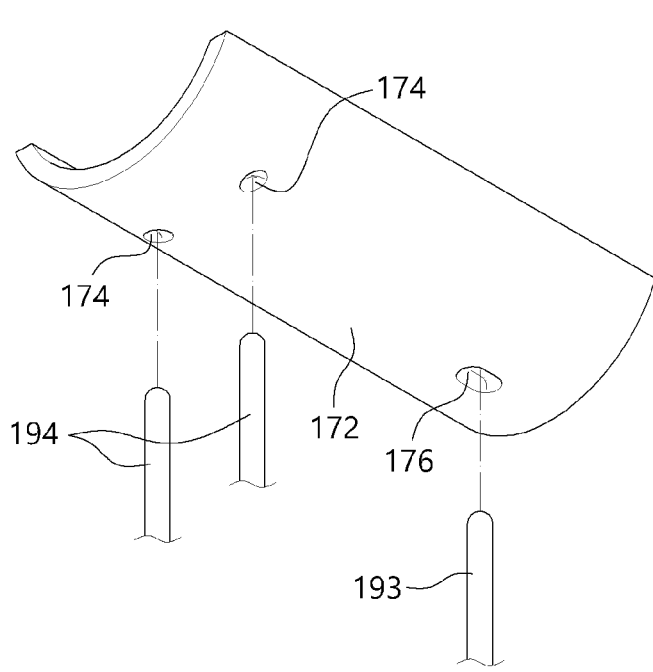

【FIG. 5】
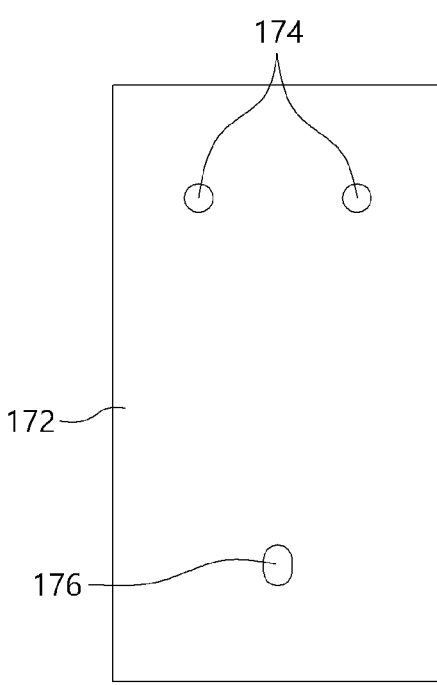

【FIG. 7】
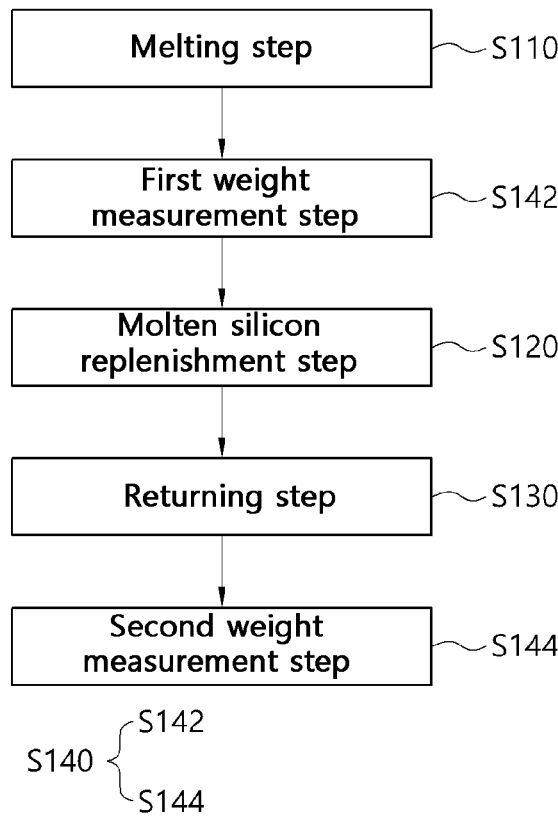

PREMELTER FOR PRELIMINARILY MELTING SILICON TO BE SUPPLIED TO MAIN CRUCIBLE AND CONTROL METHOD THEREOF

CROSS-REFERENCE TO RELATED APPLICATION

This application is a National Stage of International Application No. PCT/KR2021/011928 filed Sep. 3, 2021, claiming priority based on Korean Patent Application No. 10-2020-0124116, filed on Sep. 24, 2020, the disclosure of which is incorporated herein by reference in its entirety.

TECHNICAL FIELD

The present invention relates to a premelter for pre-melting silicon before supplying to a main crucible and a method for controlling the same, and more particularly, to a premelter for pre-melting silicon before supplying to a main crucible capable of accurately measuring an input amount of molten silicon input into an ingot growth crucible, thereby effectively controlling the input amount, and a method for controlling the same.

BACKGROUND

Single crystal silicon is used as a basic material for most semiconductor parts, and these materials are produced as single crystals having high purity, and one of these manufacturing methods is the Czochralski method.

In a general ingot growing apparatus used by the Czochralski method, seed crystals of single crystal silicon are contained in the interface of molten silicon contained in a crucible, and then the ingot is grown while being gradually raised.

Among these Czochralski methods, a continuous growth type Czochralski method (CCz) is a method of continuously growing an ingot while replenishing consumed molten silicon by continuously injecting polysilicon in a solid state into a crucible. That is, the polysilicon particles and the dopant are continuously supplied into the crucible to maintain a constant level at the interface of the molten silicon, thereby replenishing the consumption of the molten silicon during the growth of the ingot.

In the continuous growth type Czochralski method (CCz), a partition wall is generally installed inside a crucible to form a double crucible forming an inner crucible and an outer crucible, so that polysilicon in a solid state is not attached to an ingot, and polysilicon supplied in a solid state is completely melted in the outer crucible and then flows to the inner crucible.

U.S. Pat. No. 7,635,414 discloses an overflow type structure in which a solid raw material is supplied to a preliminary melting crucible and as much as an elevated liquid surface of the raw material is introduced into an ingot growth crucible.

In the case of silicon, the specific gravity is higher when it is in a liquid state than in a solid state, and due to the specific gravity, the supplied silicon material in a solid state floats on the liquid surface of the molten silicon in a liquid state. The structure is that by using this, the partition wall installed in the preliminary melting crucible blocks the inflow of the solid raw material suspended in the liquid surface, and the liquefied silicon moved through the space formed in the partition wall is located in the preliminary melting crucible and is injected into the ingot growth crucible through a supply pipe extended to the ingot growth crucible.

Such a preliminary melting crucible is formed of a quartz material having low contamination and high heat resistance, and the main body, the partition wall, and the supply pipe of the preliminary melting crucible are formed of a quartz material, which may cause an increase in cost, and may increase a risk of damage when each part is handled.

In addition, there are disadvantages in that when the high-temperature process is finished, the main body, the partition wall, the supply pipe, and the like may be damaged due to volume expansion caused by the solidification of the remaining molten silicon, and expensive parts made of quartz may be used for one-time use, which may increase costs, and may increase risks such as the need to be very careful about impacts in process operation.

In order to prevent this, since even when the process is not operated, the preliminary melting crucible must be heated, and a separate heating system must be provided for heating so that the temperature of the molten silicon does not drop in each transfer section where the molten silicon is transported, there are problems in that the design is complicated, the manufacturing cost of the equipment is increased, and energy consumption is also increased.

In addition, since the molten silicon is fused and solidified at the outlet of the supply pipe supplying the molten silicon to the ingot growth crucible, the supply pipe is blocked, making it impossible to continuously supply the molten silicon, and eventually, the operation of the ingot growing apparatus is stopped and maintenance is performed. In this way, there is a problem in that it affects the continuous operation of the equipment, reducing productivity and making it difficult to produce ingots of uniform quality.

(Patent Document 1) U.S. Pat. No. 7,635,414

SUMMARY

Technical Problem

The present invention is intended to solve the above problems, and is directed to providing a pre-melting unit of a continuous ingot growing apparatus and a control method thereof, in which a solidification and melting or sticking of molten silicon can be eliminated during a supply process of supplying the molten silicon to a crucible for ingot growth, so that the equipment can be continuously operated, and thus productivity can be improved and the quality of the ingot can be uniform.

The present invention is directed to providing a premelter for pre-melting silicon before supplying to a main crucible and a control method thereof, in which a quantity of molten silicon supplied to a crucible for ingot growth can be accurately measured.

The technical problems of the present invention are not limited to the technical problems mentioned above, and other technical problems not mentioned will be clearly understood by those of ordinary skill in the art from the following description.

Technical Solution

In order to solve such problems, according to an aspect of the present invention, disclosed is a premelter for pre-melting silicon before supplying to a main crucible, comprising a preliminary crucible for supplying silicon in a molten state to a main crucible in which an ingot is grown after heating the silicon material in a solid state to become silicon in a molten state; a preliminary crucible moving module for moving a position of the preliminary crucible so that the preliminary crucible can heat the silicon in a solid state or supply the silicon in a molten state to the main crucible; and a control unit for controlling the position of the preliminary crucible by operating the preliminary crucible moving module.

The preliminary crucible may include a container portion formed in the form of a container with an open-top; the preliminary crucible may be configured to be movable between a first position in which the container portion of the preliminary crucible contains the solid silicon material or the molten silicon, or a second position where the molten silicon in the preliminary crucible flows into the main crucible; and the preliminary crucible moving module may be configured to tilt the preliminary crucible in a range between the first position and the second position.

The preliminary crucible moving module may include a support member rotatably supporting one side of the preliminary crucible facing the main crucible; and a lifter controlled by the control unit to raise or lower the other side spaced apart in an opposite direction to the main crucible from the one side of the preliminary crucible.

At least one pair of support members may be provided to support opposite sides of the preliminary crucible.

The support member may be formed in a pin shape extending upward, and the preliminary crucible may have a hemispherical pin accommodating groove formed on a bottom surface thereof connected to the support member to accommodate an upper end of the pin-shaped support member.

The lifter may include a lifting rod extending upward and a driving unit for lifting the lift rod up and down, and the preliminary crucible may have a rod accommodating groove formed on a bottom surface thereof connected to the lifting rod to accommodate an upper end of the lifting rod.

The support member and the lifter may be hinge-coupled to the preliminary crucible.

The preliminary crucible moving module may include a weight measuring unit for measuring the weight of the preliminary crucible.

The weight measuring unit may measure the weight of the preliminary crucible by measuring a load applied to the lifter.

The control unit may be configured to first measure the weight of the preliminary crucible before the molten silicon in the preliminary crucible is supplied to the main crucible, secondarily measure the weight of the preliminary crucible after the molten silicon in the preliminary crucible is supplied to the main crucible, and measure the amount of the molten silicon supplied to the main crucible by the difference between the two measured weights.

The control unit may be configured to first measure the weight of the preliminary crucible while the preliminary crucible is moved from the first position to the second position and secondarily measure the weight of the preliminary crucible while the preliminary crucible is moved from the second position to the first position.

The control unit may be configured to first measure the weight of the preliminary crucible when the other side of the preliminary crucible is lifted by the lifter, and secondarily measure the weight of the preliminary crucible when the other side of the preliminary crucible is lowered by the lifter.

When the weight of the preliminary crucible is secondarily measured, the weight may be measured in a state where the other side of the preliminary crucible is lowered and then raised again to eliminate the effect of the backlash of the lifter.

The tilt of the preliminary crucible may be the same when the weight of the preliminary crucible is measured first and secondarily.

Meanwhile, according to another aspect of the present invention, disclosed is a method for controlling a premelter for pre-melting silicon before supplying to a main crucible, comprising a melting step of heating and melting a solid silicon material put into a preliminary crucible located at a first position; a molten silicon replenishment step of supplying molten silicon in the preliminary crucible to the main crucible by tilting the preliminary crucible at the first position to a second position; a returning step of returning the preliminary crucible to the first position after supplying molten silicon to the main crucible; and a molten silicon supply amount measuring step of measuring an amount of the molten silicon supplied to the main crucible through the preliminary crucible.

The molten silicon supply amount measuring step may include a first weight measurement step of measuring the weight of the preliminary crucible while the movement of the preliminary crucible is temporarily stopped when the preliminary crucible is moved from the first position to the second position; and a second weight measurement step of measuring the weight of the preliminary crucible while the movement of the preliminary crucible is temporarily stopped when the preliminary crucible is moved from the second position to the first position.

The second weight measurement step may be measured in a state where the other side of the preliminary crucible is lowered and then raised again.

In the first weight measurement step and the second weight measurement step, the tilt of the preliminary crucible may be the same.

Advantageous Effects

According to the premelter for pre-melting silicon before supplying to a main crucible and a control method thereof of the present invention, since the preliminary crucible of the pre-melting unit is tilted and the molten silicon of the preliminary crucible is poured and supplied into the main crucible, a separate pipe or the like can be deleted, and a blocking phenomenon caused by the molten silicon being molten and solidified can be basically eliminated, so that the equipment can be operated continuously for a long time, and thus productivity can be improved and the quality of the produced ingot can be uniform.

In addition, since the amount of the molten silicon supplied is measured by comparing the weight before and after the molten silicon in the pre-melting unit is supplied to the main crucible, a more accurate amount of the molten silicon can be measured.

In addition, since the weight can be measured in a state in which an effect caused by a mechanical backlash is eliminated, a more accurate amount of the molten silicon can be measured.

The effects of the present invention are not limited to the effects mentioned above, and other effects not mentioned will be clearly understood by those of ordinary skill in the art from the description of the claims.

BRIEF DESCRIPTION OF THE DRAWINGS

The summary set forth above as well as the detailed description of the preferred embodiments of the present application set forth below may be better understood when read in conjunction with the accompanying drawings. Preferred embodiments are shown in the drawings for the purpose of illustrating the present invention. It should be understood, however, that the present application is not limited to the precise arrangement and means illustrated.

FIG. 2 is a view showing a preliminary crucible of a pre-melting unit in a first position provided in the continuous ingot growing apparatus of FIG. 1.

FIG. 3 is a view showing a preliminary crucible of a pre-melting unit in a second position provided in the continuous ingot growing apparatus of FIG. 1.

FIG. 4 is a perspective view showing a preliminary crucible and a preliminary crucible moving module of a premelter for pre-melting silicon before supplying to a main crucible according to an embodiment of the present invention.

FIG. 5 is a view showing a bottom surface of the preliminary crucible of FIG. 4.

FIG. 6(*a*) is a view showing a state in which the preliminary crucible is in a first position.

FIG. 6(*b*) is a view showing a state in which the preliminary crucible is in a first weight measuring position.

FIG. 6(*c*) is a view showing a state in which the preliminary crucible is in a second position.

FIG. 6(*d*) is a view showing a state in which the preliminary crucible is in a second weight measuring position.

FIG. 6(*e*) is a view showing a state in which the preliminary crucible is returned to the first position.

FIG. 7 is a flow chart showing a method for controlling a premelter for pre-melting silicon before supplying to a main crucible according to an embodiment of the present invention.

DETAILED DESCRIPTION OF THE EMBODIMENTS

Figure 1:
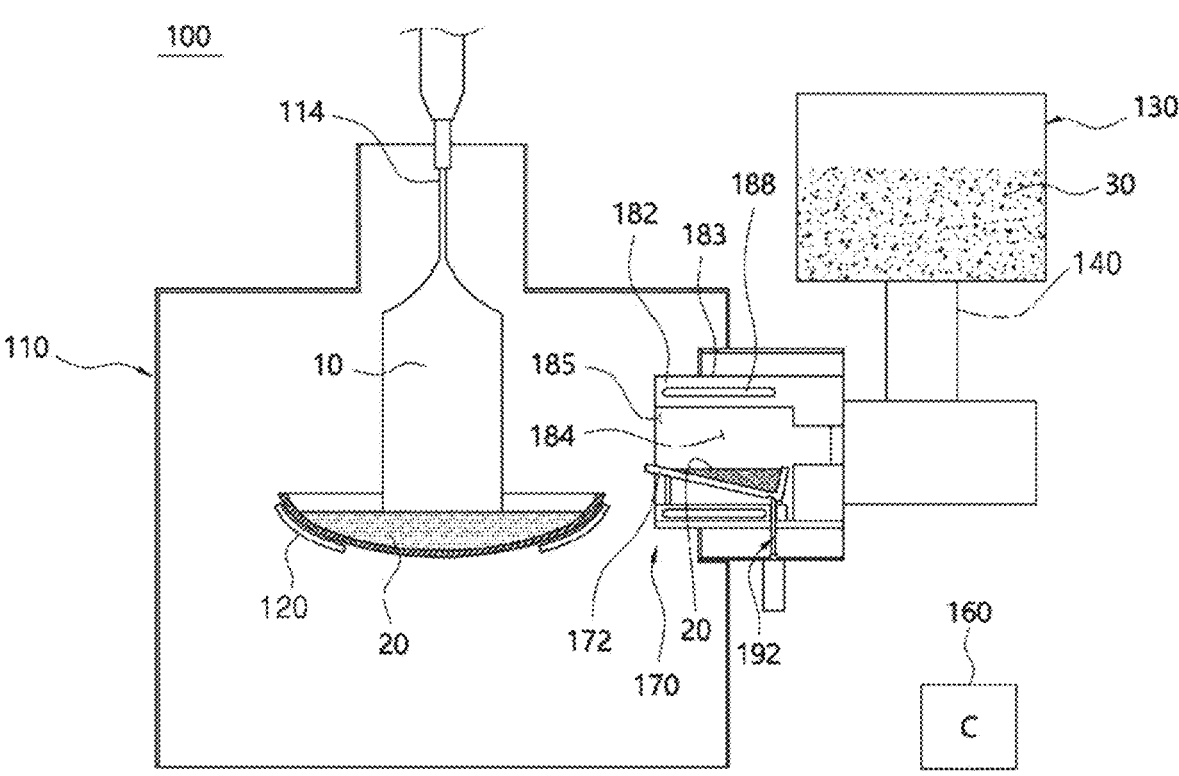
FIG. 1 is a view showing an example of a continuous ingot growing apparatus equipped with a premelter for pre-melting silicon before supplying to a main crucible according to an embodiment of the present invention.

Terms and words used in the present specification and claims should not be construed as limited to their usual or dictionary definition, and they should be interpreted as a meaning and concept consistent with the technical idea of the present invention based on the principle that inventors may appropriately define the terms and concept in order to describe their own invention in the best way.

Accordingly, the embodiments described in the present specification and the configurations shown in the drawings correspond to preferred embodiments of the present invention, and do not represent all the technical spirit of the present invention, so the configurations may have various examples of equivalent and modification that can replace them at the time of filing the present invention.

It should be understood that the terms "comprise" or "have" when used in this specification, are intended to describe the presence of stated features, integers, steps, operations, elements, components and/or a combination thereof but not preclude the possibility of the presence or addition of one or more other features, integers, steps, operations, elements, components, or a combination thereof.

The presence of an element in/on "front", "rear", "upper or above or top" or "lower or below or bottom" of another element includes not only being disposed in/on "front", "rear", "upper or above or top" or "lower or below or bottom" directly in contact with other elements, but also cases in which another element being disposed in the middle, unless otherwise specified. In addition, unless otherwise specified, that an element is "connected" to another element includes not only direct connection to each other but also indirect connection to each other.

Hereinafter, a continuous ingot growing apparatus 100 according to an embodiment of the present invention will be described with reference to the drawings.

A pre-melting unit 170 of the continuous ingot growing apparatus 100 according to this embodiment may be provided in the continuous ingot growing apparatus 100 as shown in FIG. 1.

The continuous ingot growing apparatus 100 may include a growth furnace 110, a main crucible 120, a material supply unit 130, a quantitative supply unit 140, and a pre-melting unit 170.

The growth furnace 110 may form a space in which an ingot 10 is grown, and may form a space in which the main crucible 120 is installed.

The main crucible 120 contains molten silicon 20 to be grown into an ingot 10 and may be heated. Such a main crucible 120 is formed in the form of a container with an open upper side, and may be formed round to form a part of a sphere as a whole.

In the main crucible 120, molten silicon 20 is grown into an ingot 10, and the grown ingot 10 is gradually raised to gradually increase its size and length. The growth furnace 110 may be provided with a lifting apparatus 114 or the like for lifting the ingot 10.

The material supply unit 130 may be a space in which silicon material 30 in a solid state, such as polysilicon in a solid state before being melted into the molten silicon 20, is stored.

In addition, the quantitative supply unit 140 may receive the silicon material 30 from the material supply unit 130 and measure the amount of the silicon material 30 supplied.

The solidified silicon material 30 measured in the quantitative supply unit 140 may be supplied to the pre-melting unit 170 to be described later.

The pre-melting unit 170 may be provided at one side of a chamber to bring in the solidified silicon material 30 measured from the quantitative supply unit 140, and may liquefy the brought-in solidified silicon material 30 into completely melted silicon 20 by heating the solidified silicon material. Also, the pre-melting unit 170 may supply the molten silicon 20 to the main crucible 120.

The pre-melting unit 170 may supply the molten silicon 20 to the main crucible 120 after completely melting the solid silicon material 30 supplied from the quantitative supply unit 140.

To this end, the pre-melting unit 170 may include a preliminary crucible 172 accommodating the silicon material 30 in a solid state supplied from the quantitative supply unit 140 and a preliminary crucible heating module 182 for forming a heating space 184 in which the preliminary crucible 172 is disposed and for heating the preliminary crucible 172.

Therefore, the solid silicon material 30 supplied from the quantitative supply unit 140 may be accommodated in the preliminary crucible 172, and the preliminary crucible 172 may be positioned in the heating space 184 and heated to make the supplied silicon material 30 in a solid state into the molten silicon 20 state.

In this case, the preliminary crucible heating module 182 may include a body 183 forming a heating space 184 in which the preliminary crucible 172 is accommodated and a heater 188 provided in the body 183 to heat the preliminary crucible 172.

In this case, the side of the heating space 184 facing the main crucible 120 may form an opening 185.

In addition, after the received silicon material 30 is heated by the heater 188 and melted into a molten silicon 20 state, the preliminary crucible 172 may be tilted to one side to pour and supply the molten silicon 20 into the main crucible 120.

In the description of this embodiment, the direction from the pre-melting unit 170 toward the main crucible 120 is referred to as one side, and the opposite side is referred to as the other side.

That is, the posture of the preliminary crucible 172 may be controlled to any one position of a first position where the silicon material 30 is received and the received silicon material 30 is melted, and a second position where it is tilted to pour and supply the heated and molten silicon 20 into the main crucible 120. The first position may refer to an angle at which the preliminary crucible 172 is tilted so that the silicon material 30 or the molten silicon 20 accommodated in the preliminary crucible 172 does not overflow or flow out of the preliminary crucible 172, and the second position may refer to an angle at which the preliminary crucible 172 is tilted so that the molten silicon 20 accommodated in the preliminary crucible 172 flows or pours into the main crucible 120.

In this case, when the preliminary crucible 172 is in the first position, an angle formed by the preliminary crucible 172 and an installation surface may be θ1, and when the preliminary crucible 172 is in the second position, an angle formed by the preliminary crucible 172 and an installation surface may be θ3. In addition, the installation surface is a bottom surface on which the continuous ingot growing apparatus 100 is installed, and may be a surface parallel to the ground.

To this end, a preliminary crucible moving module 192 that moves the position of the preliminary crucible 172 and a control unit 160 that controls the preliminary crucible moving module 192 may be provided.

In the embodiment of the present invention, as shown in FIGS. 2 and 3, the preliminary crucible moving module 192 may tilt one side of the preliminary crucible 172 facing the main crucible 120 toward the main crucible 120 to pour the molten silicon 20 contained in the preliminary crucible 172 into the main crucible 120.

The preliminary crucible 172 includes a container portion formed in the form of a container with an open-top, and when the preliminary crucible 172 is in the second position, a side surface of the container portion facing the main crucible 120 of the preliminary crucible 172 may be opened so that the molten silicon 20 of the preliminary crucible 172 may be easily flowed to the main crucible 120. Of course, the present invention is not limited thereto, and a side surface of the preliminary crucible 172 facing the main crucible 120 may be formed in various shapes, such as having a lower height than other side surfaces or partially opened so as to form a separate discharge port.

In addition, when the preliminary crucible 172 having the opened one side is in the first position, the opened side surface of the preliminary crucible 172 may be inclined toward the upper side in the first position so as not to overflow the silicon material 30 and the molten silicon 20 accommodated in the preliminary crucible 172.

Of course, if the preliminary crucible 172 does not have one side open, the preliminary crucible 172 may be maintained in a horizontal state without being inclined when in the first position.

In addition, when the preliminary crucible 172 is in the second position, the one side surface of the preliminary crucible 172 may be inclined toward the lower side in the second position so as to more effectively flow the molten silicon 20 accommodated in the preliminary crucible 172 to the main crucible 120.

Therefore, when the preliminary crucible 172 is inclined to the second position, the molten silicon 20 in the preliminary crucible 172 may flow along an incline by gravity through the opened side surface of the preliminary crucible 172 and then fall into the main crucible 120.

To this end, the preliminary crucible moving module 192 may include a support member 194 rotatably supported on one side of the preliminary crucible 172 with respect to the body 183, and a lifter 196 provided to lift and lower the other side of the preliminary crucible 172 in a vertical direction at a point spaced apart from the support member 194 to the other side and controlled by the control unit 160.

The support member 194 may be formed in a pin shape extending upward from the bottom surface of the body 183 of the preliminary crucible heating module, and an upper end thereof may be rounded.

In addition, the preliminary crucible may have a hemispherical pin accommodating groove 174 formed on a bottom surface thereof connected to the upper end of the pin-shaped support member 194 to accommodate the upper end of the pin-shaped support member 194.

A pair of support members 194 may be disposed to be spaced apart from each other to support opposite sides of the preliminary crucible 172.

In addition, the lifter 196 may be provided to support the preliminary crucible 172 at a point spaced apart to the other side of a point supported by the support members 194 of the preliminary crucible 172.

Therefore, the pair of support members 194 and the lifter 196 may support the preliminary crucible 172 at three points, thereby stably supporting the preliminary crucible 172.

Meanwhile, the lifter 196 may include a lifting rod 193 and a driving unit 195 as shown in FIGS. 2 and 3.

The lifting rod 193 may extend upward below the preliminary crucible 172 toward a bottom surface of the preliminary crucible 172, and may be provided to be lifted and lowered by the driving unit 195, and an end of the lifting rod 193 may be formed in a spherical shape.

The driving unit 195 may be provided to lift the lifting rod 193. Such driving unit 195 may be implemented in various structures and methods such as a structure of a motor and a gear, or as a hydraulic means, a pneumatic means, or the like.

In addition, as shown in FIG. 4 and FIG. 5, the preliminary crucible 172 may have a hemispherical rod accommodating groove 176 formed on a bottom surface thereof connected to the upper end of the pin-shaped lifting rod 193 to accommodate the upper end of the pin-shaped lifting rod 193.

Accordingly, the support member 194 and the lifter 196 may be formed in a pin or rod form, and accommodation grooves for accommodating them may be formed in the preliminary crucible 172 to be supported by gravity without any restriction.

That is, since the preliminary crucible 172 to which high heat is applied is supported by a pin and groove structure without a separate restraining device, there is an effect that the possibility of occurrence of defects such as breakage or sticking due to thermal deformation can be maximally eliminated.

Of course, it may also be possible to manufacture a structure in which the support member 194 and the lifter 196 are hinge-coupled to the bottom surface of the preliminary crucible 172.

Meanwhile, the preliminary crucible moving module 192 of this embodiment may include a weight measuring unit 197.

The weight measuring unit 197 is a component that measures the weight of the preliminary crucible 172 and may be provided to transmit the measured value to the control unit 160.

The weight measuring unit 197 as described above may be provided to measure the load applied to the lifter 196, and in this embodiment, may be implemented as a load cell or the like coupled to the lifting rod to measure the weight of the lifting rod 193 and support the preliminary crucible 172. However, the present invention is not limited thereto, and the weight of the preliminary crucible 172 may be measured using various possible structures and methods.

Meanwhile, the control unit 160 may measure the weight of the preliminary crucible 172 by controlling the driving unit 195 of the lifter 196 to control the elevation of the lifting rod 193 to control the angle of the preliminary crucible 172 as well as by using a signal measured by the weight measuring unit 197.

In addition, the control unit 160 may calculate the amount of molten silicon 20 additionally supplied from the preliminary crucible 172 to the main crucible 120 by measuring the weight of the preliminary crucible 172.

Figures 6A, 6B, 6C, 6D, 6E:
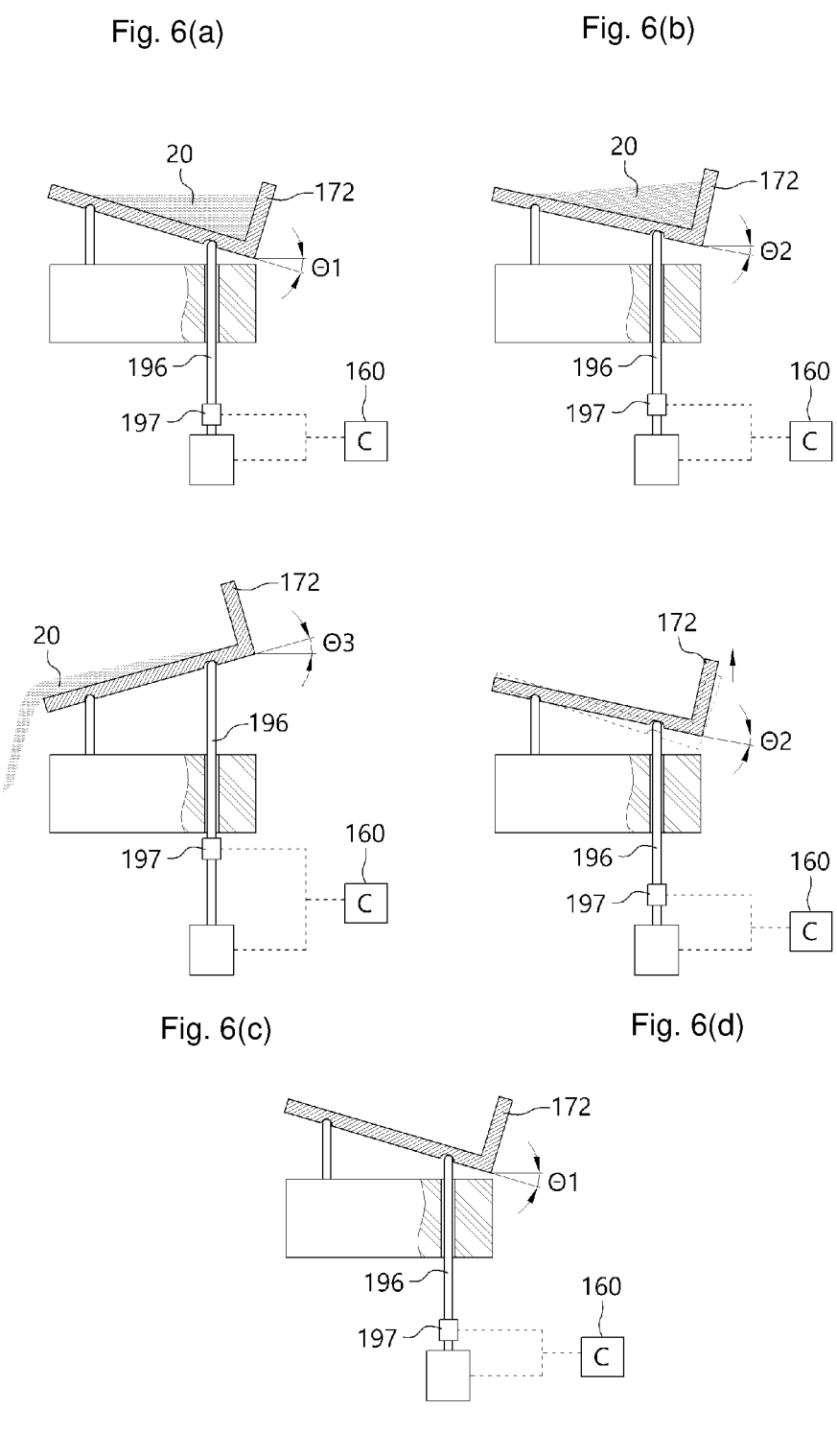
FIGS. 6(*a*)-FIG. 6(*e*) are views showing step-by-step how the preliminary crucible is tilted.

For example, as shown in (b) of FIG. 6, before the molten silicon 20 in the preliminary crucible 172 is supplied to the main crucible 120, the weight of the preliminary crucible 172 is first measured, and as shown in (d) of FIG. 6, after the molten silicon 20 in the preliminary crucible 172 is supplied to the main crucible 120, the weight of the preliminary crucible 172 is secondarily measured, and then the amount of the molten silicon 20 supplied to the main crucible 120 can be measured by the difference between the two measured weights.

To this end, when the preliminary crucible 172 is moved from the first position to the second position, the weight of the preliminary crucible 172 is first measured while the movement of the preliminary crucible 172 is temporarily stopped, and when the preliminary crucible 172 is moved from the second position to the first position, the weight of the preliminary crucible 172 is secondarily measured while the movement of the preliminary crucible 172 is temporarily stopped, and then the amount of the molten silicon 20 supplied to the main crucible 120 can be measured by the difference between the weight measured in the first measurement and the weight measured in the second measurement.

That is, when the other side of the preliminary crucible 172 is lifted by the lifter 196 of the preliminary crucible 172 to supply the molten silicon 20 to the main crucible 120, the weight of the preliminary crucible 172 is first measured while the movement of the preliminary crucible 172 is temporarily stopped, and when the other side of the preliminary crucible 172, which is elevated by the lifter 196 of the preliminary crucible 172, is lowered after supplying the molten silicon 20, the weight of the preliminary crucible 172 is secondarily measured while the movement of the preliminary crucible 172 is temporarily stopped, and then the amount of the molten silicon 20 supplied to the main crucible 120 can be measured by the difference between the weight measured in the first measurement and the weight measured in the second measurement.

Of course, when measuring the weight of the preliminary crucible 172, the preliminary crucible 172 does not necessarily have to be measured in a stopped state, and various modifications may be possible, such as measuring while the preliminary crucible 172 is moving at a constant speed or measuring regardless of whether the preliminary crucible 172 is moving and whether the preliminary crucible 172 is moving at a constant speed.

In this case, the tilt of the preliminary crucible 172 at the weighing point during the first measurement and the second measurement may be the same as θ2.

The θ2 may be an angle at which the solidified silicon material 30 or the molten silicon 20 contained in the preliminary crucible 172 does not overflow to the outside of the preliminary crucible 172 when the tilt of the preliminary crucible 172 is θ2.

Meanwhile, when a part such as a gear is applied as the driving unit 195 of the lifter 196, an error in weight measurement may occur due to a gap between parts due to backlash, etc., and in this embodiment, in order to minimize the error in weight measurement, when the weight of the preliminary crucible 172 is secondarily measured, the preliminary crucible 172 is rotated more toward the θ1 angle than the θ2 angle, so that the other side of the preliminary crucible 172 is lowered and then raised again to reach the θ2 angle, and then the weight is measured, thereby eliminating the effect of the backlash of the lifter 196.

Hereinafter, when supplying the molten silicon 20 to the main crucible 120 as the pre-melting unit 170 of the continuous ingot growing apparatus 100 described above, an embodiment of a method for controlling a premelter for pre-melting silicon before supplying to a main crucible for measuring a supply amount will be described.

As shown in FIG. 7, the method for controlling the premelter for pre-melting silicon before supplying to the main crucible according to the present embodiment may include a melting step (S110), a molten silicon replenishment step (S120), a returning step (S130), and a molten silicon supply amount measuring step (S140).

The melting step (S110) is a step of heating and melting the solid silicon material 30 put into the preliminary crucible 172 located at the first position into molten silicon 20.

In the melting step (S110), as shown in (a) of FIG. 6, the preliminary crucible 172 may have an angle of θ1, and molten silicon 20 may be contained in the preliminary crucible 172.

As shown in (c) of FIG. 6, the molten silicon replenishment step (S120) is a step of supplying the molten silicon 20 of the preliminary crucible 172 to the main crucible 120 by tilting the preliminary crucible 172 at the first position to the second position.

And, after the step of replenishing molten silicon, as shown in (d) of FIG. 6, the returning step (S130) of returning the preliminary crucible 172 to the first position may be performed.

Meanwhile, the molten silicon supply amount measuring step (S140) is a step of measuring the amount of molten silicon 20 supplied to the main crucible 120 through the preliminary crucible 172, and may include a first weight measurement step (S142) and a second weight measurement step (S144).

As shown in (b) of FIG. 6, the first weight measurement step (S142) is a step of measuring the weight of the preliminary crucible 172 while the movement of the preliminary crucible 172 is temporarily stopped when the preliminary crucible 172 is moved from the first position to the second position. At this time, the preliminary crucible 172 may be positioned at an angle of θ2.

In addition, as shown in (d) of FIG. 6, the second weight measurement step (S144) is a step of measuring the weight of the preliminary crucible 172 while the movement of the preliminary crucible 172 is temporarily stopped when the preliminary crucible 172 is moved from the second position to the first position. At this time, the preliminary crucible 172 may be positioned at an angle of θ2.

In addition, in the second weight measurement step, the weight may be measured in a state in which the preliminary crucible 172 lowered by the lifter 196 is lowered more than the θ2 angle and then raised to the θ2 angle again. This is to eliminate the effect of the backlash of the lifter 196.

Therefore, the control unit 160 may accurately measure the amount of molten silicon 20 supplied to the main crucible 120 through the preliminary crucible 172 in the molten silicon replenishment step (S120) by the difference between the weight measured in the first weight measurement step (S142) and the weight measured in the second weight measurement step (S144).

As described above, preferred embodiments according to the present invention have been examined, and it is obvious to those skilled in the art that the present invention can be embodied in other specific forms without departing from the spirit or scope of the present invention in addition to the above-described embodiments. Therefore, the above-described embodiments are to be construed as illustrative rather than restrictive, and accordingly, the present invention is not limited to the above description and may be modified within the scope of the appended claims and their equivalents.

What is claimed is:

1. A premelter for pre-melting silicon before supplying to a main crucible, comprising:
   a preliminary crucible configured to heat silicon in a solid state to convert the silicon into a molten state, and to supply the silicon in the molten state to the main crucible in which an ingot is grown;
   a preliminary crucible moving module for moving a position of the preliminary crucible so that the preliminary crucible can heat the silicon in the solid state or supply the silicon in the molten state to the main crucible; and
   a control unit configured to control the position of the preliminary crucible by operating the preliminary crucible moving module,
   wherein the preliminary crucible moving module comprises a support member rotatably supporting one side of the preliminary crucible facing the main crucible,
   wherein the support member is formed in a pin shape extending upward,
   wherein the preliminary crucible has a hemispherical pin accommodating groove formed on a bottom surface thereof connected to the support member to accommodate an upper end of the support member formed in the pin shape, and
   wherein the hemispherical pin accommodating groove is configured to accommodate the support member without any separate restraining device.

2. The premelter for pre-melting silicon before supplying to the main crucible of claim 1, wherein the preliminary crucible comprises a container portion formed in the form of a container with an open-top,
   wherein the preliminary crucible is configured to be movable between a first position in which the container portion of the preliminary crucible contains the silicon in the solid state or the silicon in the molten state, and a second position where the silicon in the molten state in the preliminary crucible flows into the main crucible, and
   wherein the preliminary crucible moving module is configured to tilt the preliminary crucible in a range between the first position and the second position.

3. The premelter for pre-melting silicon before supplying to the main crucible of claim 2, wherein the preliminary crucible moving module further comprises: a lifter controlled by the control unit to raise or lower the other side spaced apart in an opposite direction to the main crucible from the one side of the preliminary crucible.

4. The premelter for pre-melting silicon before supplying to the main crucible of claim 3, wherein the support member is provided as a pair of support members to support opposite sides of the preliminary crucible.

5. The premelter for pre-melting silicon before supplying to the main crucible of claim 3, wherein the lifter comprises:
   a lifting rod extending upward; and
   a driving unit for lifting the lifting rod up and down, and
   wherein the preliminary crucible has a rod accommodating groove formed on the bottom surface thereof connected to the lifting rod to accommodate an upper end of the lifting rod.

6. The premelter for pre-melting silicon before supplying to the main crucible of claim 3, wherein the support member and the lifter are hinge-coupled to the preliminary crucible.

7. The premelter for pre-melting silicon before supplying to the main crucible of claim 3, wherein the preliminary crucible moving module comprises a load cell configured to measure a weight of the preliminary crucible.

8. The premelter for pre-melting silicon before supplying to the main crucible of claim 7, wherein the load cell measures the weight of the preliminary crucible by measuring a load applied to the lifter.

9. The premelter for pre-melting silicon before supplying to the main crucible of claim 7, wherein the control unit is configured to:
   measure a first weight of the preliminary crucible before the silicon in the molten state in the preliminary crucible is supplied to the main crucible,
   measure a second weight of the preliminary crucible after the silicon in the molten state in the preliminary crucible is supplied to the main crucible, and
   measure an amount of the silicon in the molten state supplied to the main crucible by a difference between the first weight and the second weight.

10. The premelter for pre-melting silicon before supplying to the main crucible of claim 9, wherein the control unit is configured to:
   measure the first weight of the preliminary crucible while the preliminary crucible is moved from the first position to the second position, and
   measure the second weight of the preliminary crucible while the preliminary crucible is moved from the second position to the first position.

11. The premelter for pre-melting silicon before supplying to the main crucible of claim 9, wherein the control unit is configured to:

measure the first weight of the preliminary crucible when the other side of the preliminary crucible is lifted by the lifter, and measure the second weight of the preliminary crucible when the other side of the preliminary crucible is lowered by the lifter.

12. The premelter for pre-melting silicon before supplying to the main crucible of claim 11, wherein when the second weight of the preliminary crucible is measured, the second weight is measured in a state where the other side of the preliminary crucible is lowered and then raised again to eliminate an effect caused by backlash of the lifter.

13. The premelter for pre-melting silicon before supplying to the main crucible according to claim 9, wherein the tilt of the preliminary crucible is the same when the first weight of the preliminary crucible is measured and when the second weight of the preliminary crucible is measured.

* * * * *